(12) United States Patent
Lorenz

(10) Patent No.: US 6,452,414 B1
(45) Date of Patent: Sep. 17, 2002

(54) LOW CURRENT POWER-ON SENSE CIRCUIT

(75) Inventor: Perry Scott Lorenz, Fort Collins, CO (US)

(73) Assignee: National Semiconductor Corp. Inc., Santa Clara, CA (US)

( * ) Notice: Subject to any disclaimer, the term of this patent is extended or adjusted under 35 U.S.C. 154(b) by 29 days.

(21) Appl. No.: 09/718,292

(22) Filed: Nov. 21, 2000

(51) Int. Cl.[7] .............................................. G01R 31/26
(52) U.S. Cl. ..................................... 324/765; 324/158.1
(58) Field of Search ................................. 324/765, 767, 324/768, 769, 158.1; 327/73, 77, 205, 206, 214; 323/315, 316; 330/257

(56) References Cited

U.S. PATENT DOCUMENTS

| | | | | |
|---|---|---|---|---|
| 5,391,979 A | * | 2/1995 | Kajimoto et al. | 323/313 |
| 5,546,054 A | * | 8/1996 | Maccarrone et al. | 327/103 |
| 5,629,614 A | * | 5/1997 | Choe et al. | 323/315 |
| 6,008,679 A | * | 12/1999 | Masuda | 327/205 |
| 6,275,075 B1 | * | 8/2001 | Min | 327/77 |

\* cited by examiner

*Primary Examiner*—Michael Sherry
*Assistant Examiner*—Minh N. Tang
(74) *Attorney, Agent, or Firm*—Brett A. Hertzberg; Merchant & Gould P.C.

(57) ABSTRACT

A power-on sense circuit accurately senses a power-on condition when a power supply voltage exceeds a desired trigger voltage level. The power-on sense circuit includes a voltage-to-current converter circuit and a beta-multiplier reference circuit. The voltage-to-current converter circuit and the beta-multiplier reference circuit generate currents that relate to the power supply voltage. By sensing a balanced current operating condition with the beta-multiplier reference circuit, the power-on sense circuit determines when a desired trigger voltage has been achieved. The trigger voltage level has a zero temperature coefficient at median operating temperatures, and has a slightly downward curvature shape without the need for high-current resistor-dividers or bandgap circuits. The power-on sense circuit may be adapted for use as a power-on reset signal. By adding an amplifier stage to the outputs signal, the power-on sense circuit may also be used as an analog reference voltage generator. The design of the power-on sense circuit is scalable and may be used under low-voltage and low-current operating conditions.

20 Claims, 5 Drawing Sheets

LOW CURRENT POWER-ON SENSE CIRCUIT

FIELD OF THE INVENTION

The present invention relates to a method and apparatus for detecting a power-on condition in an electronic circuit. In particular, the present invention relates to electronic power-on sense circuits that operate under low power and low current conditions.

BACKGROUND OF THE INVENTION

Various power-on detector circuits are used in electronic systems to ensure that a predictable power-up condition can be achieved. In digital circuits, it is possible that a digital logic circuit may find a trapped state or other undetermined condition during power up. Similarly, in analog circuits, a particular circuit may find a condition where transistors lock themselves in an off condition during power. Start-up and logic initialization problems may be avoided by incorporating circuitry into the electronic system that initializes each of the various circuits to a known condition. A predictable power-on reset circuit may be employed to detect the power-on condition and appropriately initialize the various circuits during a power-on sequence.

SUMMARY OF THE INVENTION

Briefly stated, in accordance with the present invention a power-on sense circuit accurately senses a power-on condition when a power supply voltage exceeds a desired trigger voltage level. The power-on sense circuit includes a voltage-to-current converter circuit and a beta-multiplier reference circuit The voltage-to-current converter circuit and the beta-multiplier reference circuit generate currents that relate to the power supply voltage. By sensing a balanced current operating condition with the beta-multiplier reference circuit, the power-on sense circuit determines when a desired trigger voltage has been achieved. The trigger voltage level has a zero temperature coefficient at median operating temperatures, and has a slightly downward curvature shape without the need for high-current resistor-dividers or bandgap circuits. The power-on sense circuit may be adapted for use as a power-on reset signal. By adding an amplifier stage to the output signal, the power-on sense circuit may also be used as an analog reference voltage generator. The design of the power-on sense circuit is scalable and maybe used under low-voltage and low-current operating conditions.

According to a feature of the invention, an apparatus for sensing a power-on condition in an electronic system having a power supply with an associated power supply voltage, includes: a first circuit that produces a first current in response to the power supply voltage, a second circuit that produces a second current that is a beta multiple of the first current, and a third circuit that produces an output signal in response to comparing the first current to the second current such that the output signal indicates the power-on condition when the power supply voltage reaches a trigger voltage. The first, second and third circuits may be combined into a single circuit. The first circuit may include a transistor having a gate connected to the power supply voltage such that the transistor conducts the first current by converting the power supply voltage to the first current. Similarly, the gate connection of the transistor may be coupled to another voltage that is related to the power supply voltage such that another current is produced by the transistor responsive to the power supply voltage. The first circuit may also include a current mirror circuit that produces the first current in response to another current that is related to the power supply voltage.

According to a further feature of the invention, the source of the transistor in the first circuit is coupled to a circuit ground through a fourth circuit. The fourth circuit may include at least one of a resistor, a transistor, and a diode. The fourth circuit is arranged to change the trigger voltage by changing the voltage that appears at a source terminal of the transistor relative to the transistors gate voltage.

According to another feature of the invention, the output signal is generated when currents are balanced in the first and second circuits. The second circuit is a beta-multiplier circuit. The second circuit includes a first transistor and a second transistor that share a common gate connection, wherein a ratio is associated with the beta of the first transistor and the beta of the second transistor, and the ratio is different from unity such that the first transistor and the second transistor have balanced currents at the trigger voltage. The first and second transistors are arranged to operate in weak inversion when the power supply voltage is at the trigger voltage. Also, the second circuit includes a resistor that is coupled between the source of the second transistor and a circuit ground. The first and second transistors operate at a bias point between square-law operation and exponential operation when the power supply voltage is at the trigger voltage. The output signal has a substantially zero temperature coefficient for median temperatures. An amplifier circuit may be adapted to produce an analog reference signal in response to the output signal. Also, an inverter circuit may be employed to produce a digital signal in response to the output signal. A capacitor may be coupled to the apparatus and arranged to couple the power supply voltage to at least one of the first, second, and third circuits such that the output signal is initialized to an operating state and changes in the power supply voltage require a transition time before the output signal changes to another operating state.

According to another feature of the invention, a method of sensing a power-on condition in an electronic system, includes: converting a power supply voltage to a sense current that is related to the power supply voltage, mirroring the sense current to produce a second current, generating a reference current that is a beta multiple of the second current, comparing the reference current to the second current, and producing an output signal in response to comparing the reference current to the second current such that the output signal indicates a first operating state when the power supply voltage is a first voltage, and a second operating state when the power supply voltage is a second voltage different from the first voltage whereby the power-on condition is sensed when the output signal indicates the second operating state. Generating the reference current includes conducting the second current with a first transistor and conducting the reference current with a second transistor that is a beta multiple of the first transistor.

According to still another feature of the invention, an apparatus for sensing a power-on condition, includes: a means for producing a first current related to a power supply voltage, a means for producing a second current that is a beta multiple of the first current, a means for producing an output signal that is responsive to a comparison between the first current and the second current such that the output signal indicates a power-on condition when the power supply voltage is at a trigger voltage. The apparatus may further include means for generating one of a digital signal and an analog reference voltage from the output signal.

A more complete appreciation of the present invention and its improvements can be obtained by reference to the accompanying drawings, which are briefly summarized below, to the following detail description of presently preferred embodiments of the invention, and to the appended claims.

DETAILED DESCRIPTION OF THE PREFERRED EMBODIMENT

The present invention uses a voltage-to-current converter to sense the power supply condition, and a beta-multiplier reference current to determine when a power-on condition has been achieved. By comparing the current that is related to the power supply voltage to a reference current, the power-on condition is sensed. The result of the comparison can be used to generate a digital signal indicating a power-on signal or an analog reference voltage. The design is scalable to lower and higher trigger voltages, and uses very little power.

Figure 1:
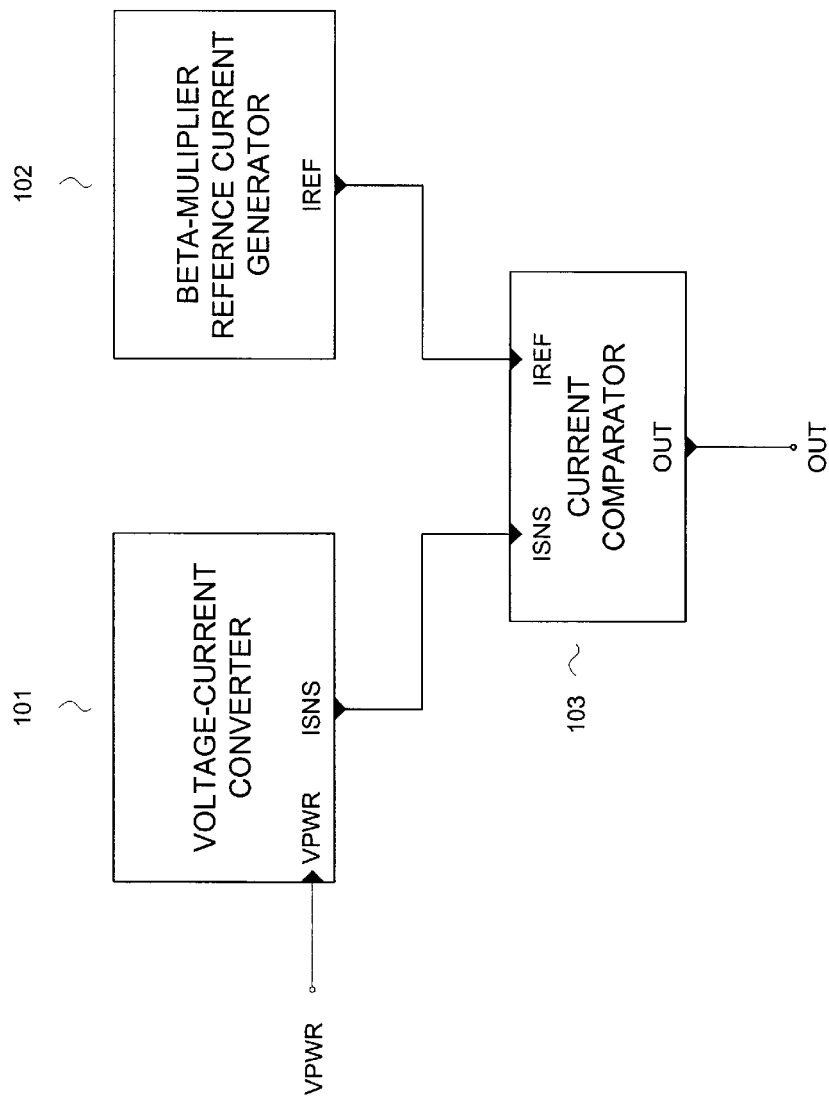
FIG. 1 is a block diagram of a power-on sensor in accordance with the present invention.

FIG. 1 is a block diagram of an exemplary power-on sensor in accordance with the present invention. A voltage-to-current converter (101) produces a sense current (ISNS) that is related to a power supply voltage (VPWR). A beta-multiplier reference current generator (102) produces a reference current (IREF). A current comparator (103) produces an output signal (OUT) in response to the sense current (ISNS) and the reference current (IREF). Although the voltage-to-current converter (101), the beta-multiplier reference current generator (102), and the current comparator (103) are shown as different blocks, it is understood and appreciated that the blocks may be combined without departing from the present invention.

First Embodiment

Figure 2:
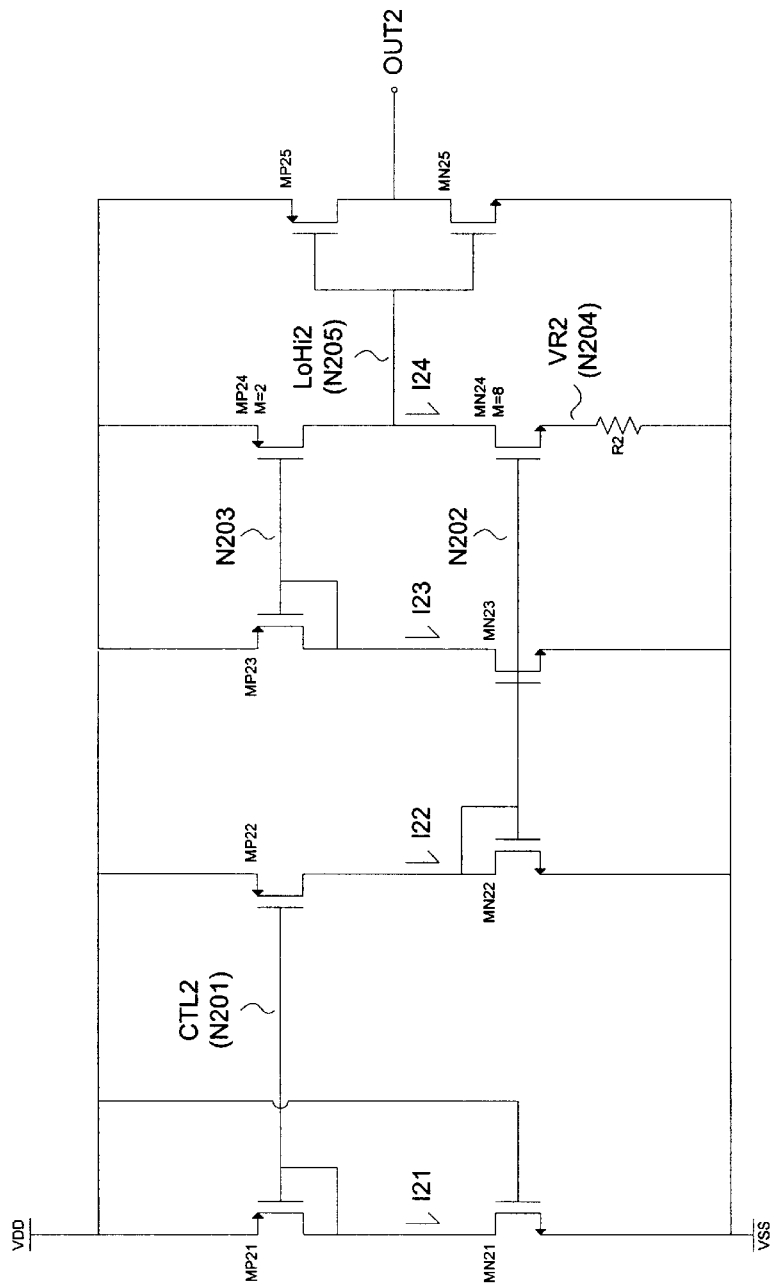
FIG. 2 is a schematic diagram of a power-on sensor in accordance with a first embodiment of the present invention.

FIG. 2 is a schematic diagram of a power-on sensor in accordance with a first embodiment of the present invention. As shown in the figure, the power-on sensor includes five PMOS transistors (MP21–MP25), five NMOS transistors (MN21–MN25), and a resistor (R2). PMOS transistor MP21 has a gate and drain connected to node N201 (CTL2), and a source connected to VDD. NMOS transistor MN21 has a gate connected to VDD, a drain connected to node N201, and a source connected to VSS. PMOS transistor MP22 has a source connected to VDD, a gate connected to node N201 and a drain connected to node N202. NMOS transistor MN22 has a drain and gate connected to node N202, and a source connected to VSS. PMOS transistor MP23 has a gate and drain connected to node N203, and a source connected to VDD. NMOS transistor MN23 has a gate connected to node N202, a drain connected to node N203, and a source connected to VSS. PMOS transistor MP24 is two transistors connected in parallel with one another, each transistor having a gate connected to node N203, a drain connected to node N205 (LoHi2), and a source connected to VDD. NMOS transistor MN24 is eight transistors connected in parallel with one another, each transistor having a gate connected to node N202, a drain connected to node N205, and a source connected to N204 (VR2). Resistor R2 is connected between node N204 and VSS. PMOS transistor MP25 has a gate connected to node N205, a drain connected to OUT2 and a source connected to VDD. NMOS transistor MN25 has a gate connected to node N205, a drain connected to OUT2, and a source connected to VSS.

Transistor MN21 is configured to act as a voltage-to-current conversion device providing a current (I21) to a mirror pair formed with transistors MP21 and MP22.

The W/L (width/length) ratio of transistor MN21 will determine the voltage-to-current conversion level and set an operating current level over a specified operating range. For trigger levels at higher power supply voltages, the W/L ratio of transistor MN21 may be reduced. In applications where the operating currents may be increased, the circuit device sizes may be reduced to conserve chip area. A variety of voltage-to-current conversion circuits may be used in substitution of the arrangement shown with regards transistor MN21.

Transistor MP22 is configured to mirror the current flowing in transistor MP21. Transistors MP22 and MN22 conduct a current (I22) that is proportional to the current (I21) flowing in transistor MP21. When transistors MP21 and MP22 are the same size, currents I21 and I22 will be equal to one another. Transistors MN22 and MN23 are configured as another current mirror such that transistor MN23 conducts a current (I23) that is proportional to the current (I22) flowing in transistor MN22. When transistors MN22 and MN23 are the same size, currents I22 and I23 will be equal to one another.

Transistors MN23 and MN24, and R2 are configured as a beta-multiplier reference circuit, where MN24 is eight transistors of equal size (to MN23) connected in parallel to one another. When the current in MN23 balances the current in MN24, then the balanced currents are the reference current, and the node LoHi2 is at a trigger level midway between the power supply voltages (VDD, VSS).

Transistors MP25 and MN25 form an inverter cell with an input at the LoHi2 node, and an output at the OUT2 node.

Transistors MP23 and MP24 are configured as another current mirror where MP24 is two transistors of equal size (to MP23) connected in parallel to one another. Transistor MP24 conducts a current (I24) that is twice the current (I23) in Resistor MP23. Although FIG. 2 shows transistor MP24 as two transistors in parallel with one another (m=2), any number of transistors may be employed as is necessary to set a correct trip point for the power-on sense circuit.

Figure 5:
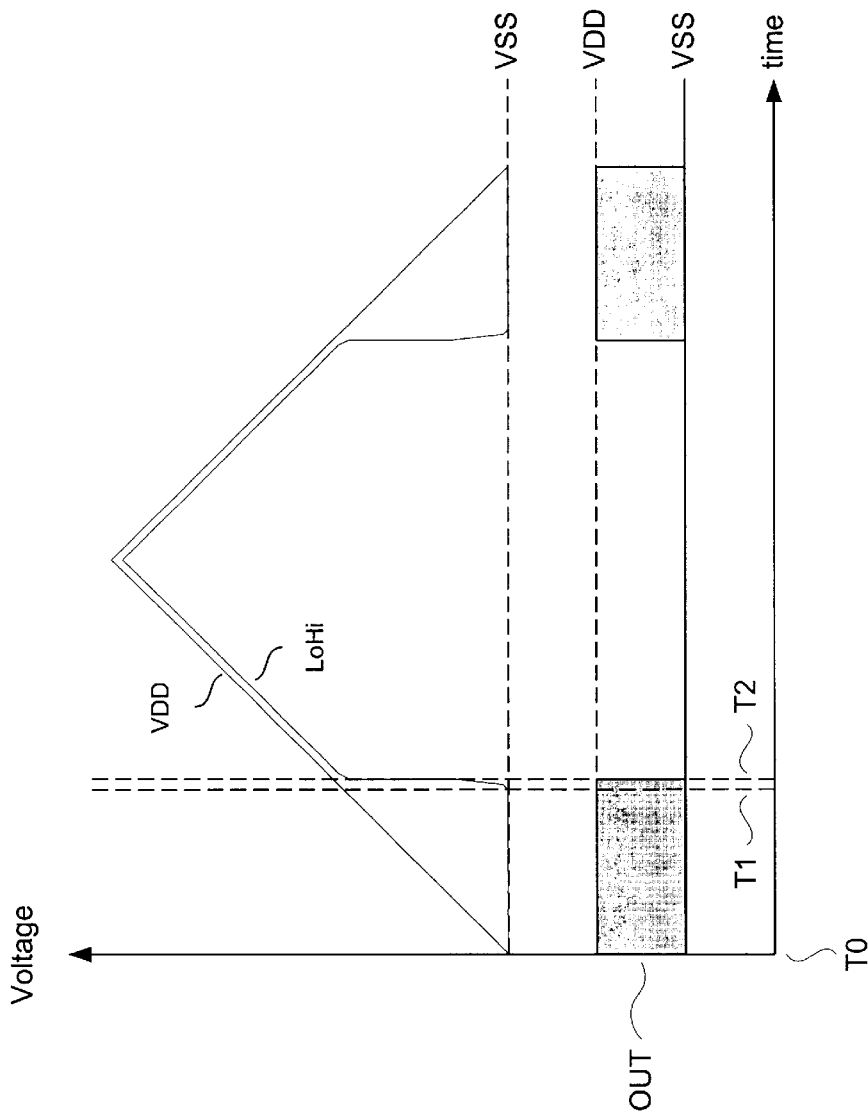
FIG. 5 is a graph of signal waveforms in accordance with an embodiment of the present invention.

The operation of the circuit shown in FIG. 2 will be discussed with reference to the signal waveforms shown in FIG. 5. At time T0, the power supply voltage (VDD) is at the same potential as VSS, and the output signal (OUT2, shown as OUT in FIG. 5) is at the same potential as VDD. The outputs signal (OUT2) will remain high until the voltage at the LoHi2 (N205) node transitions from low to high, indicating that the power-on sequence is complete.

The power supply voltage (VDD) increases from time T0 through T1, causing the currents I21 and I22 to increase accordingly. The I22 current is mirrored by MN22, MN23, and MN24. The current mirrored by MP23 and MP24 is twice that of I23 (m=2 for MP24). Since MN24 can support four times the current I24 (m=8 for MN24), at low current levels, the drain of transistor MN24 holds LoHi2 at a low logic level. As the power supply voltage increases, the current levels increase and a significant IR drop develops across resistor R2. The increased voltage drop across resistor R2, results in current I23 increasing at a rate faster than the current levels supported by transistor MN24.

Eventually the currents (I23, I24) reach the reference current level where the currents I23 and I24 are balanced. When the currents (I23 and I24) are balanced the node LoHi2 is at a potential midway between the power supply rails. The power supply voltage that generates this balanced current value is the trigger voltage for the current comparator (103 in FIG. 1).

As the power supply voltage continues to increase beyond the trigger voltage the current levels rise above the reference current level. Once the currents rise above the reference level, transistor MN24 and resistor R2 can no longer sink all the current that transistor MP24 provides. Then, node LoHi2 continues to rise to the high power supply voltage (VDD) and OUT2 transitions to a low logic level.

Transistors MN23 and MN24 are operated in weak inversion at the trigger level such that the trigger voltage occurs at a bias point that is between square-law operation and exponential operation. The first end point is calculated according to square-law operation as:

$$VDDT1 = \frac{y}{R_2 * Kpn} + Vthn_{21} \quad (1)$$

$$y = \sqrt{\frac{2*x}{\frac{W_{N23}}{L_{N23}} * \frac{W_{N21}}{L_{N21}}}} \quad (2)$$

$$x = \frac{\left(1 - \sqrt{\frac{n}{m}}\right)^2 * 2}{n^2 * b^2} \quad (3)$$

$$m = \frac{\beta_{N24}}{\beta_{N23}} \quad (4)$$

$$n = 2 \quad (5)$$

VDDT1 corresponds to the low end point of the trigger voltage. Parameter n corresponds to the ratio of the current in transistor MP24 and MP23 (shown as 2 in FIG. 2). Parameter m corresponds to the ratio of beta for transistors MN24 and MN23. Beta is determined by the equation beta=Kp*(W/L). Kpn is the transconductance of an NMOS transistor (based on mobility and oxide capacitance), and $Vthn_{21}$ is the threshold voltage of transistor MN21. The W and L parameters correspond to the geometric sizes of transistors MN23 and MN21. The parameter b relates to the body effect for transistor MN24, and is modeled as a factor that increases resistor R2. In one example of this application b=1.44, n=2, m=8, R=580 KΩ, VDDT 1 may be on the order of 1.5V.

The second end point of operation is weak inversion operation, where the trigger voltage is calculated according to an exponential law operation as:

$$VDDT2 = h * \sqrt{\frac{Vu}{R_2 * Kpn}} + Vthn_{21} \quad (6)$$

$$h = \frac{\sqrt{2*eta*\ln\left(\frac{m}{n}\right)}}{\sqrt{\frac{W_{21}}{L_{21}}}} \quad (7)$$

VDDT 2 corresponds to the high end point of the trigger voltage. As before, parameter n corresponds to the ratio of the current in transistor MP24 and MP23 (shown as 2 in FIG. 2), and parameter m corresponds to the ratio of beta for transistor MN24 and MN23. Kpn is the transconductance for an NMOS transistor (based on mobility and oxide capacitance), and $Vthn_{21}$ is the threshold voltage of transistor MN21. Vu is the thermal voltage (26 mV at 300 deg K). Eta is the sub-threshold slope coefficient and in one example is equal to 1.68 for an NMOS transistor. For the same MOS process described previously, VDDT2 may be on the order of 2.6V. The actual trigger voltage lies between VDDT1 and VDDT2 at roughly 2.0V.

Resistor R2 and transistors MN23 and MN24 are at the core of the beta multiplier cell. Transistor MN24 is a beta multiple of transistor MN23. In one example, at the trigger voltage, a voltage of 59 mV appears across a 580 KΩ resistor and corresponds to a current of roughly 102 nA.

The above embodiment is a temperature compensated power-on-detector with two different temperature coefficients based on the operating region. For the square law region of operation, the temperature coefficient is given by:

$$TC\_VDDT1 = \left(\frac{-y}{R_2 * Kpn}\right) * (TC\_Kpn + TC\_R_2) + TC\_Vthn_{21}$$

For the exponential region of operation, the temperature coefficient given by:

$$TC\_VDDT2 = \left(0.5 * h * \sqrt{\frac{Vu}{R_2 * Kpn}}\right) * (TC\_Vu - TC\_R_2 - TC\_Kpn) + TC\_Vthn_{21}$$

The sign of TC__VDDT1 and TC__VDDT2 are opposite in direction. The opposite signed temperature coefficients results in a trigger voltage with a zero temperature coefficient for median temperatures, and has a downward temperature curvature. The temperature curvature is balanced when the low temperature and high temperature values are equal.

The temperature curvature is adjusted by changing the W/L ratio of transistors MN23 and MN24. When the length (L) of transistors MN23 and MN24 are increased, the temperature curve tilts forward towards the square-law operational region (TC__VDDT 1). Increased lengths produces larger overdrive voltages on MN23 and MN24. Also, the increased lengths result in the temperature coefficients of R2_TC and Kpn_TC canceling one another, leaving Vthn_TC as a dominant temperature coefficient. When the length (L) of transistors MN23 and MN24 are decreased, the temperature curve tilts backwards towards the exponential operational region (TC__DDT2). By adjusting the lengths of the transistors, the temperature curvatures can be adjusted so that a zero temperature curve result can be achieved for a wide range of trigger voltages.

Second Embodiment

Figure 3:
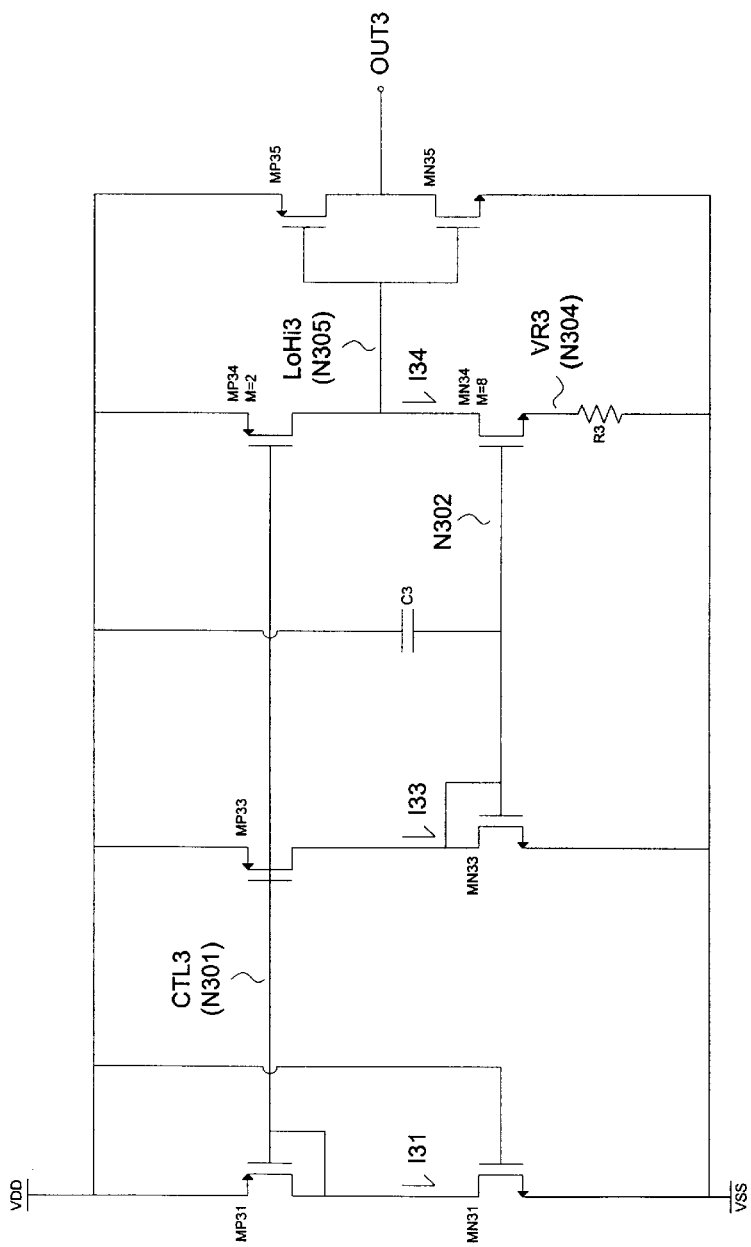
FIG. 3 is a schematic diagram of a power-on sensor in accordance with a second embodiment of the present invention.

FIG. 3 is a schematic diagram of a power-on sensor in accordance with a second embodiment of the present invention. As shown in the figure, the power-on sensor includes four PMOS transistors (MP31, MP33–MP35), four NMOS transistors (MN31, MN33–MN35), a resistor (R3), and a capacitor (C3). PMOS transistor MP31 has a gate and drain connected to node N301 (CTL3), and a source connected to VDD. NMOS transistor MN31 has a gate connected to VDD, a drain connected to node N301, and a source connected to VSS. PMOS transistor MP33 has a source connected to VDD, a gate connected to node N301 and a drain connected to node N302. NMOS transistor MN33 has a drain and gate connected to node N302, and a source connected to VSS. PMOS transistor MP34 is two transistors connected in parallel with one another, each transistor having a gate connected to node N301, a drain connected to node N305 (LoHi3), and a source connected to VDD. NMOS transistor MN34 is eight transistors connected in parallel with one another, each transistor having a gate connected to node N302, a drain connected to node N305, and a source connected to N304 (VR3). Resistor R3 is connected between node N304 and VSS. Capacitor C3 is connected between node N302 and VDD. PMOS transistor MP35 has a gate connected to node N305, a drain connected to OUT3 and a source connected to VDD. NMOS transistor MN35 has a gate connected to node N305, a drain connected to OUT3, and a source connected to VSS.

The operation of the circuit shown in FIG. 3 is similar to the operation of the circuit described previously with respect to the first embodiment. However, transistors MN22 and MP22 from the first embodiment have been eliminated from use in the second embodiment. Transistor MN23 in the first embodiment is now replaced by transistor MN33, which is a diode connected transistor. Additionally, a capacitor (C3) has been connected between node N302 and VDD in the second embodiment. When a fast power-up sequence is initiated with a fast change in the VDD power supply, capacitor C3 functions to hold the voltage at node N302 at VDD. By holding node N302 at VDD, transistors MN33 and MN34 are positively turned on to ensure that OUT3 begins in a high logic state. The voltage at node N302 will gradually drop down to an operating voltage where OUT3 drops to a low logic state. The capacitor (C3) prevents a momentary glitch from appearing in the output signal (OUT3) when the power supply (VDD) transitions rapidly. Similar to the discussion with respect to the first embodiment, the second embodiment operates by a beta multiple between transistors MP33 and MP34 (instead of MP23 and MP24), and another beta multiple between transistors MP32 and MP34 (instead of MP23 and MP24).

Third Embodiment

Figure 4:
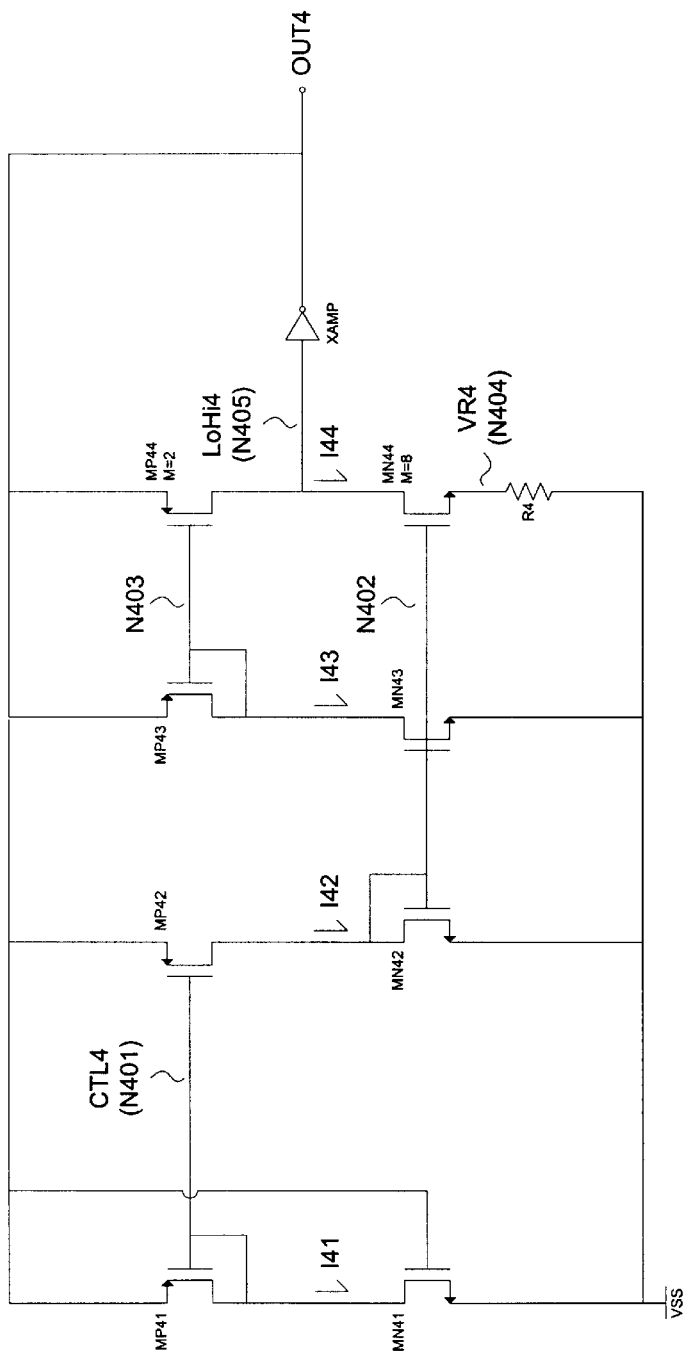
FIG. 4 is a schematic diagram of a reference generator in accordance with a third embodiment of the present invention.

FIG. 4 is a schematic diagram of a reference generator in accordance with a third embodiment of the present invention. As shown in the figure, the reference generator includes four PMOS transistors (MP41–MP44), four NMOS transistors (MN41–MN44), a resistor (R4), and an amplifier (XAMP). PMOS transistor MP41 has a gate and drain connected to node N401 (CTL4), and a source connected to OUT4. NMOS transistor MN41 has a gate connected to OUT4, a drain connected to node N401, and a source connected to VSS. PMOS transistor MP342 has a source connected to OUT4, a gate connected to node N401 and a drain connected to node N402. NMOS transistor MN42 has a drain and gate connected to node N402, and a source connected to VSS. PMOS transistor MP43 has a gate and drain connected to node N403, and a source connected to OUT4. NMOS transistor MN43 has a gate connected to node N402, a drain connected to node N403, and a source connected to VSS. PMOS transistor MP44 is two transistors connected in parallel with one another, each transistor having a gate connected to node N403, a drain connected to node N405 (LoHi4), and a source connected to OUT4. NMOS transistor MN44 is eight transistors connected in parallel with one another, each transistor having a gate connected to node N402, a drain connected to node N405, and a source connected to N404 (VR4). Resistor R4 is connected between node N404 and VSS. Amplifier XAMP has an input connected to node N405 and an output connected to OUT4.

The operation of the circuit shown in FIG. 3 is similar to the operation of the circuit described previously with respect to the first embodiment. However, instead of producing an output signal that is a logic signal (i.e. OUT2 in FIG. 2 is driven by an inverter), the output signal (OUT4) is a voltage provided by an amplifier (XAMP).

Amplifier XAMP is shown configured as an inverting buffer. The amplifier (XAMP) is internally connected to the VDD and VSS power supplies. Initially the output of the LoHi4 (N405) node is low (VSS) since no power is applied. As power is applied, the amplifier will begin to operate with gain. Since amplifier XAMP is an inverting amplifier with voltage gain, the output of the amplifier will be at the high power supply (VDD). Thus, the power provided to the high power supply connection (OUT4) is the same as the VDD power supply provided to the first embodiment. As the power supply ramps up towards the trigger voltage, the LoHi4 node will begin to rise rapidly as in the first embodiment. Since the trigger voltage will be balanced at a particular OUT4 voltage, the output of the amplifier will regulate the output signal to the trigger voltage. The amplifier can also be configured to provide other voltages by appropriate configuration of the amplifier with voltage dividers or other gain setting mechanisms.

The above specification, examples and data provide a complete description of the manufacture and use of the composition of the invention. Since many embodiments of the invention can be made without departing from the spirit and scope of the invention, the invention resides in the claims hereinafter appended.

I claim:

1. An apparatus for sensing a power-on condition in an electronic system having a power supply with an associated power supply voltage, comprising:

a first circuit that produces a first current in response to the power supply voltage;

a second circuit that produces a second current that is a beta multiple of the first current; and a third circuit that produces an output signal in response to comparing the first current to the second current such that the output signal indicates the power-on condition when the power supply voltage reaches a trigger voltage.

2. The apparatus as in claim 1, wherein the first circuit includes a first transistor having a gate connected to the power supply voltage such that the first transistor conducts the first current by converting the power supply voltage to the first current.

3. The apparatus as in claim 1, wherein the first circuit includes a first current mirror circuit that produces the first current in response to a third current that is related to the power supply voltage.

4. The apparatus as in claim 3, wherein the first circuit further includes a second transistor having a gate terminal coupled to a gate voltage that is related to the power supply voltage such that the third current is produced by the second transistor responsive to the power supply voltage.

5. The apparats as in claim 4, wherein the source of a third transistor is coupled to a circuit ground through a fourth circuit.

6. The apparatus as in claim 5, wherein the fourth circuit includes at least one of a resistor, a transistor, and a diode, and the fourth circuit is arranged to change the rigger voltage by changing a first voltage that appears at a source terminal of the third transistor relative to a second voltage that appears at a gate terminal of the third transistor.

7. The apparatus as in claim 1, wherein the second circuit includes the third circuit such that the first current and the second current are compared by the second circuit and the second circuit generates the output signal when The first current and the second current are balanced.

8. The apparatus as in claim 1, wherein the second circuit is a beta-multiplier circuit.

9. The apparatus as in claim 1, wherein the second circuit includes a first transistor and a second transistor that share a common gate connection, wherein a ratio is associated with the beta of the first transistor and the beta of the second transistor, and the ratio is different from unity such that the first transistor and the second transistor have balanced currents at the trigger voltage.

10. The apparatus as in claim 9, wherein the first and second transistors are arranged to operate in weak inversion when the power supply voltage is at the trigger voltage.

11. The apparatus as in claim 9, wherein the second circuit further includes a resistor coupled between the source of the second transistor and a circuit ground.

12. The apparatus as in claim 11, wherein the it and second transistors operate at a bias point between squarelaw operation and exponential operation when the power supply voltage is at the trigger voltage.

13. The apparatus as in claim 11, wherein the first and second transistors operate in weak inversion when the power supply voltage is at the trigger voltage, and the output signal has a substantially zero temperature coefficient for median temperatures.

14. The apparatus as in claim 1, further comprising an amplifier circuit that produces an analog reference signal in response to the output signal.

15. The apparatus as in claim 1, further comprising an inverter circuit that produces a digital signal in response to the output signal.

16. The apparatus as in claim 1, further comprising a capacitor that is arranged to couple the power supply voltage to at least one of the first, second, and third circuits such that the output signal is initialized to an operating state and changes in the power supply voltage require a transition time before the output signal changes to another operating state.

17. A method of sensing a power-on condition in an electronic system, comprising:
 (a) converting a power supply voltage to a sense current that is related to the power supply voltage;
 (b) mirroring the sense current to produce a second current;
 (c) generating a reference current that is a beta-multiple of the second current;
 (d) comparing the reference current to the second current; and
 (e) producing an output signal in response to comparing the reference current to the second current such that the output signal indicates a first operating state when the power supply voltage is a first voltage, and a second operating state when the power supply voltage is a second voltage different from the first voltage whereby the power-on condition is sensed when the output signal indicates the second operating state.

18. The method of sensing a power-on condition as in claim 17, wherein generating the reference current includes conducting the second current with a first transistor and conducting the reference current with a second Resistor that is a beta-multiple of the first transistor.

19. An apparatus for sensing a power-on condition, comprising:
 (a) a means for producing a first current related to a power supply voltage;
 (b) a means for producing a second current that is a beta multiple of the first current;
 (c) a means for producing an output signal that is responsive to a comparison between the first current and the second current such that the output signal indicates a power-on condition when the power supply voltage is at a trigger voltage.

20. The apparatus as in claim 19, further comprising means for generating one of a digital signal and an analog reference voltage from the output signal.

* * * * *

UNITED STATES PATENT AND TRADEMARK OFFICE
CERTIFICATE OF CORRECTION

PATENT NO.   : 6,452,414 B1
DATED        : September 17, 2002
INVENTOR(S)  : Perry Scott Lorenz It is certified that error appears in the above-identified patent and that said Letters Patent is hereby corrected as shown below:

<u>Title page,</u>
Item [73], Assignee, "National Semiconductor Corp. Inc." should read
-- National Semiconductor Corporation --

<u>Column 8,</u>
Line 62, "the rigger voltage" should read -- the Trigger voltage --

<u>Column 10,</u>
Line 22, "a second Resistor that" should read -- a second transistor that --

Signed and Sealed this

Eleventh Day of March, 2003

JAMES E. ROGAN
*Director of the United States Patent and Trademark Office*